United States Patent
Yu et al.

(10) Patent No.: US 8,805,304 B2
(45) Date of Patent: Aug. 12, 2014

(54) LINEARIZATION OF BROADBAND POWER AMPLIFIERS

(75) Inventors: Qian Yu, Santa Clara, CA (US); Rajeev Krishnamoorthy, Saratoga, CA (US); Olivier Charlon, San Francisco, CA (US)

(73) Assignee: Scintera Networks LLC, Wilmington, DE (US)

( * ) Notice: Subject to any disclaimer, the term of this patent is extended or adjusted under 35 U.S.C. 154(b) by 0 days.

(21) Appl. No.: 13/343,631

(22) Filed: Jan. 4, 2012

(65) Prior Publication Data

US 2013/0099862 A1    Apr. 25, 2013

Related U.S. Application Data

(60) Provisional application No. 61/551,308, filed on Oct. 25, 2011.

(51) Int. Cl.
*H04B 1/04*    (2006.01)
(52) U.S. Cl.
USPC ............... 455/114.3; 455/126; 455/127
(58) Field of Classification Search
USPC ............................................. 455/114.3
See application file for complete search history.

(56) References Cited

U.S. PATENT DOCUMENTS

| | | | | |
|---|---|---|---|---|
| 5,732,333 | A * | 3/1998 | Cox et al. | 455/126 |
| 5,786,728 | A * | 7/1998 | Alinikula | 330/149 |
| 6,879,641 | B2 * | 4/2005 | Unger | 375/296 |
| 7,804,359 | B1 | 9/2010 | Cova | |
| 7,844,014 | B2 | 11/2010 | Keerthi et al. | |
| 8,064,850 | B2 * | 11/2011 | Yang et al. | 455/114.3 |
| 8,121,560 | B1 | 2/2012 | Anaraki et al. | |
| 8,170,508 | B2 * | 5/2012 | Davies | 455/114.3 |
| 2002/0048326 | A1 * | 4/2002 | Sahlman | 375/297 |
| 2003/0045253 | A1 * | 3/2003 | Hongo et al. | 455/127 |
| 2006/0232332 | A1 * | 10/2006 | Braithwaite | 330/149 |
| 2008/0187035 | A1 * | 8/2008 | Nakamura et al. | 375/232 |
| 2010/0297966 | A1 * | 11/2010 | Row et al. | 455/114.3 |
| 2011/0095819 | A1 * | 4/2011 | Velazquez | 330/149 |
| 2012/0106600 | A1 * | 5/2012 | Yu et al. | 375/219 |

* cited by examiner

*Primary Examiner* — Ajibola Akinyemi

(57) ABSTRACT

An RF linearizer and an associated method are provided for linearizing a power amplifier. The RF linearizer may include: (a) a quadrature up-converter for up-converting a baseband input signal that is to be transmitted by the power amplifier; (b) an RF analog predistorter controlled by a set of coefficients for predistorting the up-converted input signal; (c) a down-converter for down-converting an output signal of the power amplifier; (d) an error monitor receiving the down-converted output signal and the input signal for providing an error signal; and (e) a signal analyzer receiving the error signal, the signal analyzer using an out-of-band power spectrum of the error signal to optimize the set of coefficients. The input signal may have an in-phase component and a quadrature component.

32 Claims, 5 Drawing Sheets

RF power amplifier linearizer

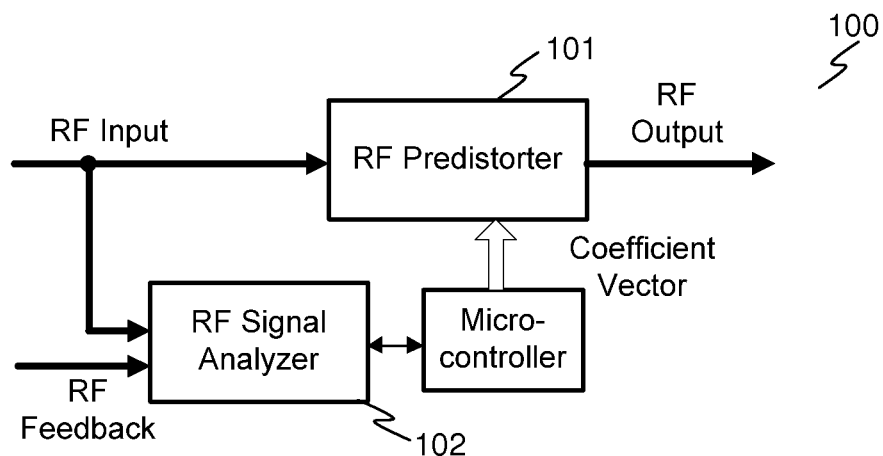
Figure 1. RF power amplifier linearizer
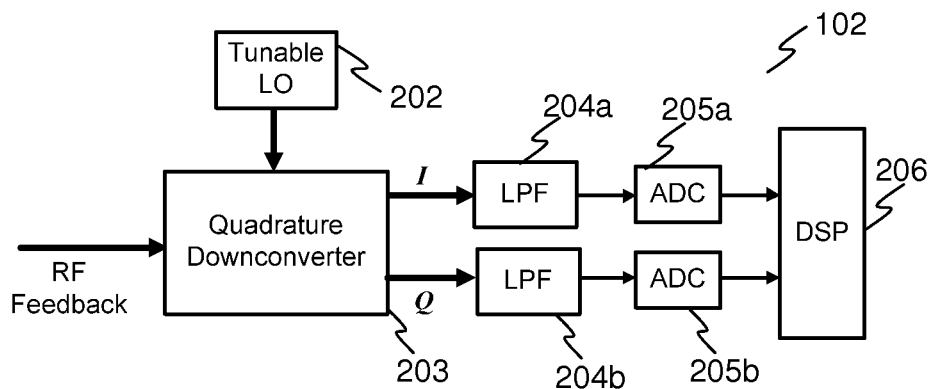
Figure 2. RF-to-digital downconvertion
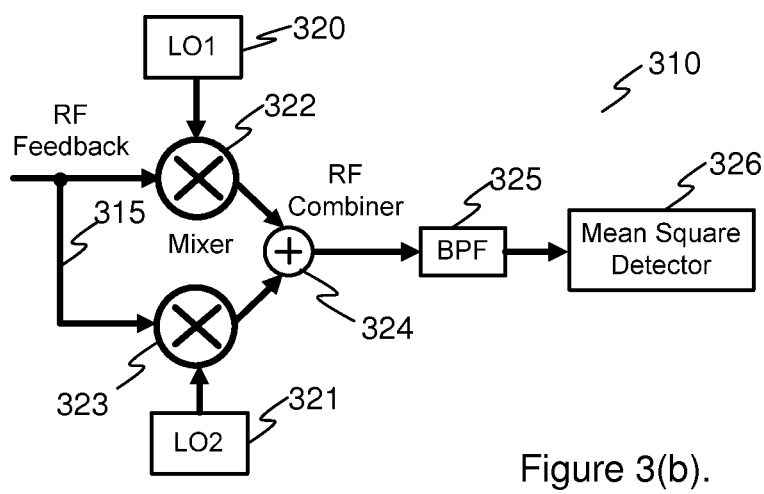
Figure 3(b).

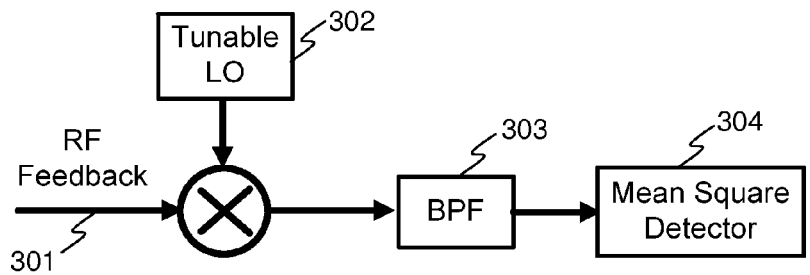
Figure 3(a). Subsystem for power spectrum monitoring
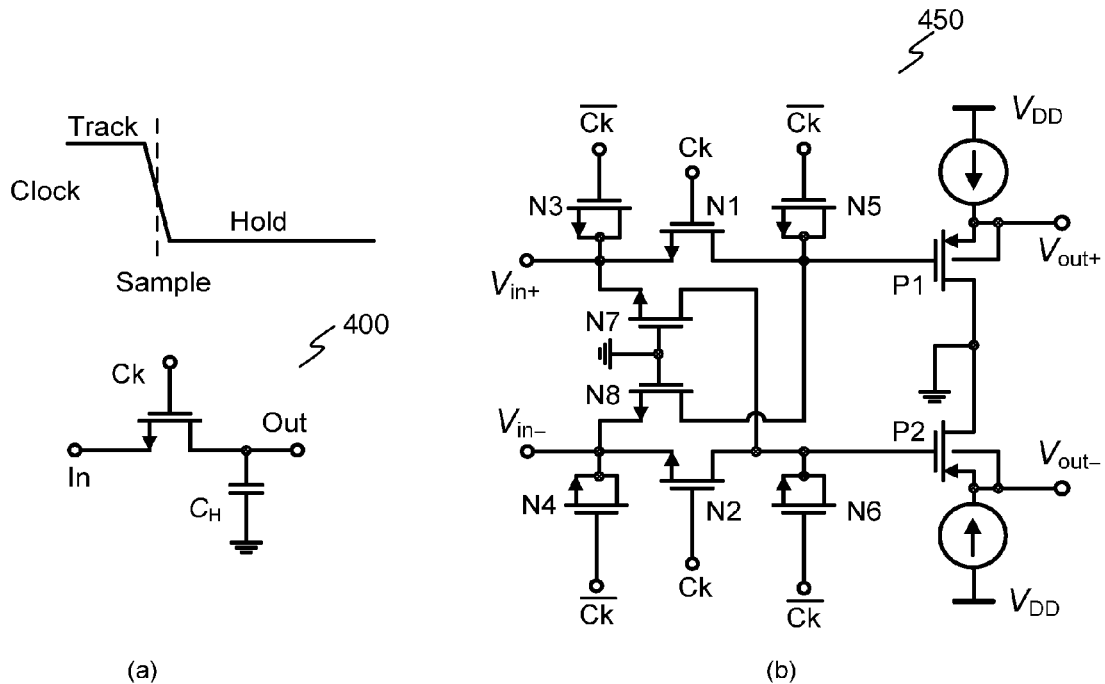
Figure 4. a) Simple switch-capacitor T/H circuit, b) Pseudo-differential T/H circuit in CMOS

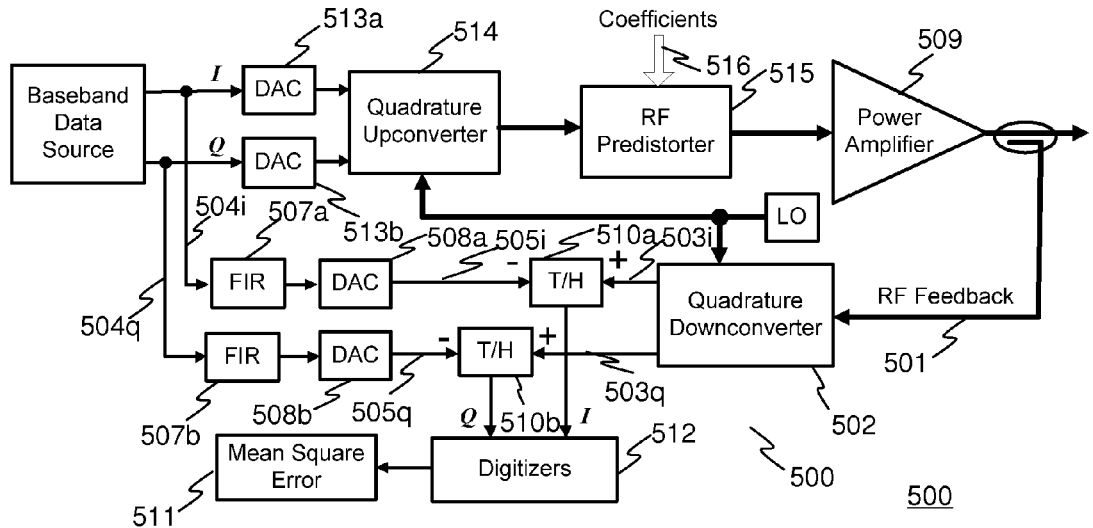
Figure 5. Adaptation of RF predistortion by minimizing the mean-square error
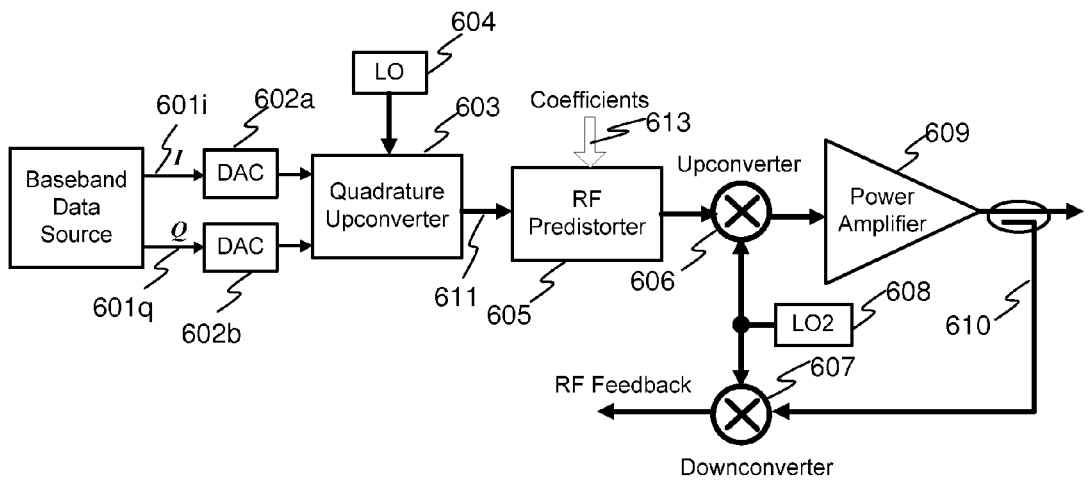
Figure 6. Predistortion at analog intermediate frequency

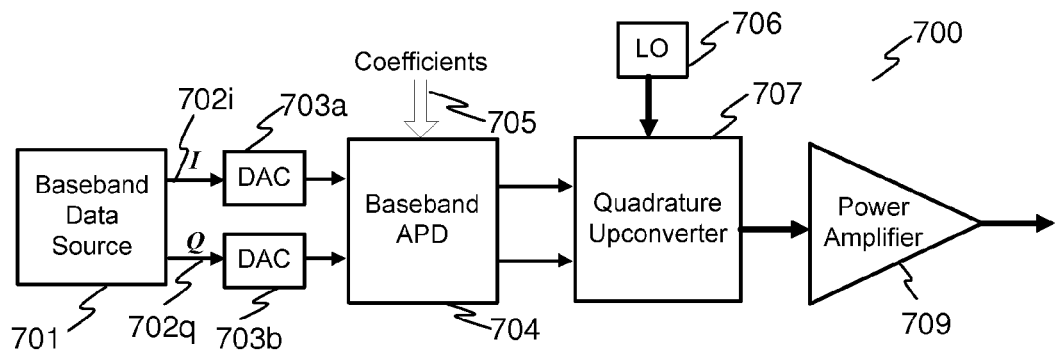
Figure 7. Predistortion at analog baseband
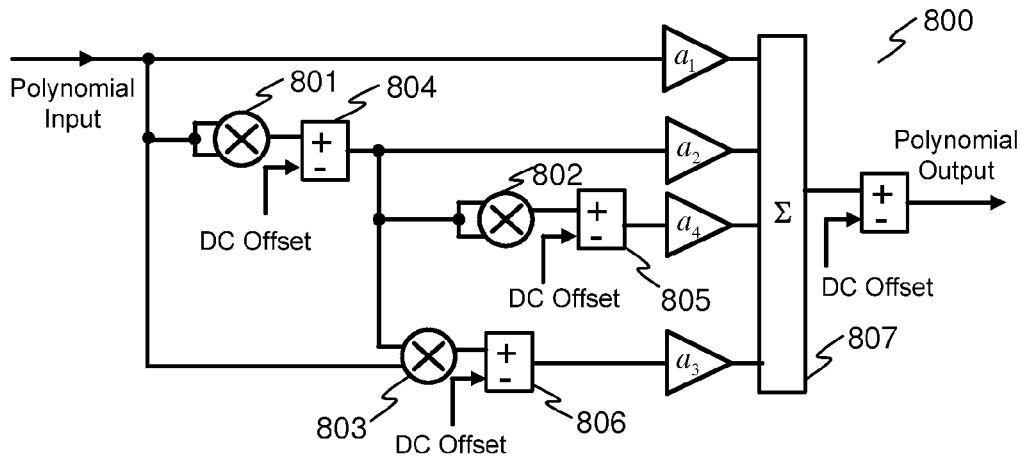
Figure 8. Block diagram of an analog polynomial circuit
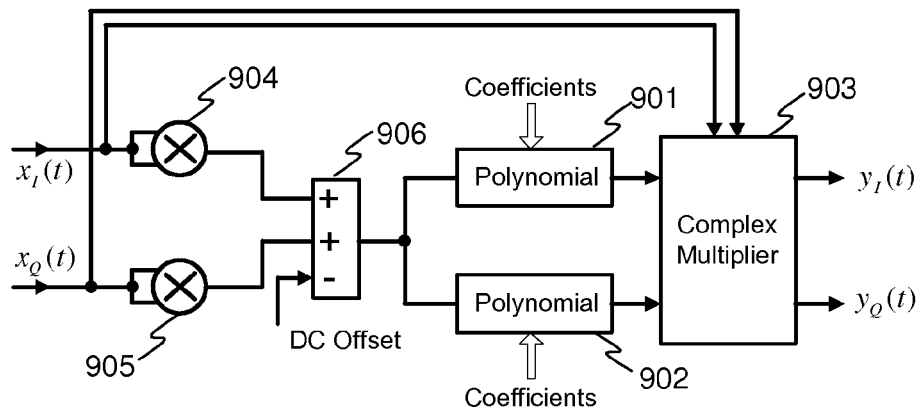
Figure 9. Block diagram of a memoryless predistorter

LINEARIZATION OF BROADBAND POWER AMPLIFIERS

CROSS-REFERENCE TO RELATED APPLICATIONS

The present application is related to and claims priority of U.S. provisional patent application ('Provisional Patent Application'), entitled "Linearization of Broadband Power Amplifiers," Ser. No. 61/551,308, filed on Oct. 25, 2011. The Provisional Patent Application is hereby incorporated by reference herein in its entirety.

BACKGROUND OF THE INVENTION

1. Field of the Invention

The present invention relates to techniques for linearizing a power amplifier ("PA"). In particular, the present invention relates to techniques for linearizing a power amplifier with a bandwidth exceeding 100 MHz.

2. Discussion of Related Art

There is a great need for linearized, broadband power amplifiers. In this context, the term "broadband" refers to an RF signal bandwidth that is greater than 100 MHz. Conventional techniques in the prior art are inadequate or uneconomical for linearizing a power amplifier over such a broadband. For example, the digital pre-distortion (DPD) circuitry that is required for such linearization must operate at a sampling rate exceeding 5 times the RF signal bandwidth. This and other many technical challenges (e.g., power constraints) and practical constraints (e.g., reasonable system cost), DPD are unsuitable for linearization of broadband signals.

SUMMARY

The present invention provides a method and an RF linearizer for a power amplifier. The RF linearizer may include: (a) a quadrature up-converter for up-converting a baseband input signal that is to be transmitted by the power amplifier; (b) an RF analog predistorter controlled by a set of coefficients for predistorting the up-converted input signal; (c) a down-converter for down-converting an output signal of the power amplifier; (d) an error monitor receiving the down-converted output signal and the input signal for providing an error signal; and (e) a signal analyzer receiving the error signal, the signal analyzer using an out-of-band power spectrum of the error signal to optimize the set of coefficients. The input signal may have an in-phase component and a quadrature component.

In one embodiment, the up-converter up-converts the input signal to an intermediate frequency between baseband and a frequency at which the input signal is to be transmitted power amplifier. The down-converter may also down-convert the output signal to the intermediate frequency. The error monitor may be implemented using one or more track and hold circuits.

In one embodiment, the input signal is filtered by a set of finite impulse response (FIR) filters prior to being received into the error monitor. Such FIR filters may be designed to reduce mean square error in the error signal, and the set of RF predistorter's coefficients may be designed to reduce the residue mean square error in the error signal.

The present invention provides also a method and a linearizer for a power amplifier that performs predistortion of a baseband input signal. Such a linearizer may include (a) a baseband analog predistorter for predistorting the baseband input signal; and (b) an up-converter for up-converting the predistorted baseband input signal to a frequency designated for transmission by the power amplifier. Again, the baseband input signal may include an in-phase component and a quadrature component. Digital-to-analog converters may be provided to convert the baseband input signal to an analog signal for the baseband analog predistorter.

In one embodiment, the baseband analog predistorter may be implemented using one or more polynomial circuits, with each polynomial circuit implementing a polynomial function in the form of $$f(x) = \sum_{k=1}^{n} a_k x^k,$$

where n is an integer greater than one. The polynomial circuit may include analog multipliers, summers and one or more complex multipliers. In some applications, summers may be provided for eliminating a DC offset voltage associated with each analog multiplier.

In one embodiment, the baseband analog predistorter further comprises a delay filter for delaying the baseband input signal to compensate for memory effects in the power amplifier. The delay filter may be an analog delay element (e.g., an off-chip analog delay element) or a digital delay element.

The present invention is better understood upon consideration of the detailed description below in conjunction with the accompanying drawings.

BRIEF DESCRIPTION OF THE DRAWINGS

FIG. 1 shows exemplary RFPAL system 100, which includes RF pre-distorter (RFPD) 101 and RF signal analyzer (RFSA) 102.

FIG. 2 shows an RFSA that performs RF-to-digital down-conversion followed by digital signal processing.

FIG. 3(a) shows a technique for real-time monitoring of the out-of-band (OOB) emission power of a broadband RF signal.

FIG. 3(b) shows an OOB emission monitor 310 for signals at two selected frequencies, in accordance with one embodiment of the present invention.

FIG. 4(a) provides exemplary T/H circuit 400; FIG. 4(b) shows a schematic circuit of a pseudo-differential T/H circuit in a CMOS implementation.

FIG. 5 shows system 500, which architecture uses a sampled error monitor circuit, according to one embodiment of the present invention.

FIG. 6 shows an analog-IF predistortion technique for linearizing broadband amplifiers operating at microwave frequencies in accordance with one embodiment of the present invention.

FIG. 7 illustrates predistortion being performed at an analog baseband, when digital baseband data are available, in accordance with one embodiment of the present invention.

FIG. 8 shows analog polynomial circuit 800, implementing the function $$f(x) = \sum_{k=1}^{4} a_k x^k,$$

according to one embodiment of the present invention.

FIG. 9 shows memory-less polynomial pre-distorter 900, using analog polynomial circuits 901 and 902, in accordance with one embodiment of the present invention.

Figure 10:
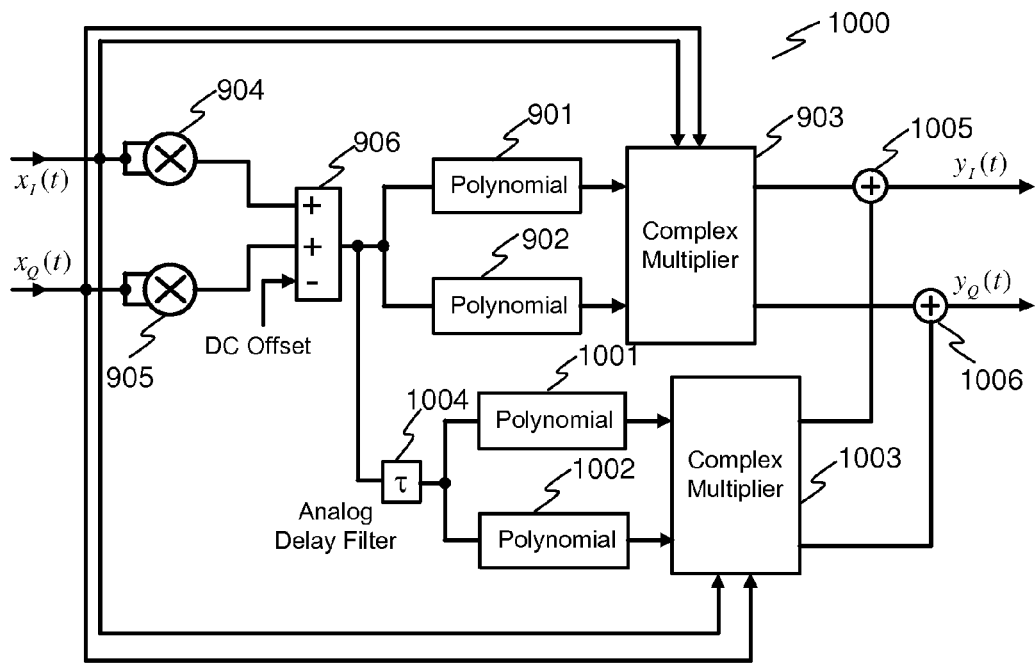

FIG. 10 shows baseband analog predistorter 1000, having the capability of compensating for memory effects in a power amplifier, according to one embodiment of the present invention.

Figure 11:
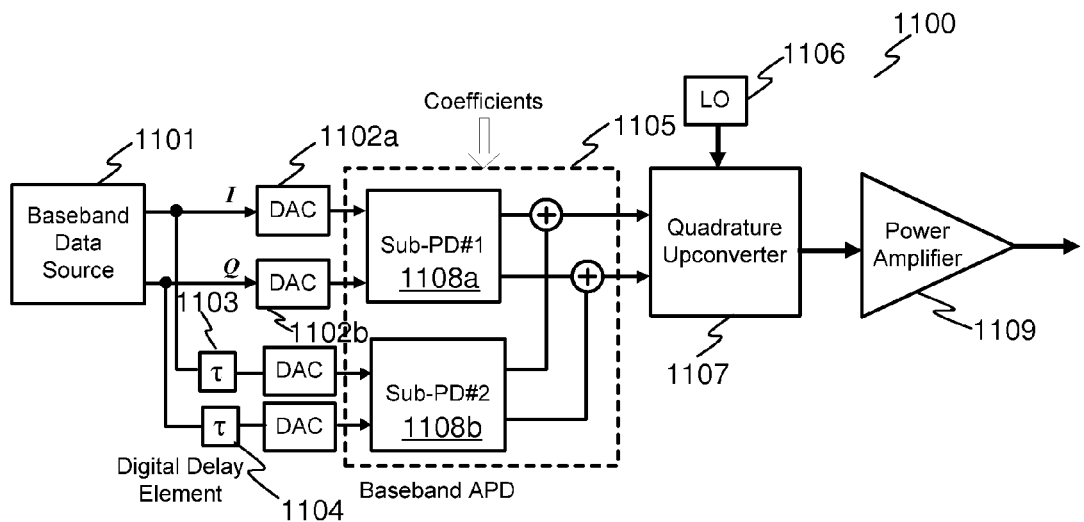

FIG. 11 illustrates system 1100, which includes baseband analog predistorter 1005, using digital delay elements, in accordance with one embodiment of the present invention.

DETAILED DESCRIPTION OF THE PREFERRED EMBODIMENTS

A class of RF power amplifier linearizers (RFPALs) have been developed based on adaptive analog pre-distortion. Examples of RFPALS are disclosed, for example, in copending U.S. patent application ("Copending Application"), Ser. No. 12/939,067, entitled "Analog Signal Processor for Nonlinear Predistortion of Radio-Frequency Signals," filed on Nov. 3, 2010. The disclosure of Copending Application is hereby incorporated by reference in its entirety.

FIG. 1 shows exemplary RFPAL system 100, which includes RF pre-distorter (RFPD) 101 and RF signal analyzer (RFSA) 102. RFPD subsystem 101 is typically a digitally controlled analog circuit, generally consisting of analog multipliers, summers, and delay elements. The digital controller may be digital filters characterized by a set of adaptively adjusted filter coefficients ("RFPD coefficients"). Using CMOS technology, for example, such analog multiplier and summer circuits can be designed to have multi-GHz bandwidths to allow the RFPD to process broadband signals. In one system, such as that shown in FIG. 2, an RFSA subsystem (e.g., RFSA 102) performs RF-to-digital down-conversion in quadrature down-converter 203 using tunable local oscillator (LO) 202. After filtering in low-pass filters (LPFs) 204a and 204b and digitization in analog-to-digital converters (ADCs) 205a and 205b, subsequent signal processing is performed in the digital domain by digital signal processor (DSP) 206. The RFSA subsystem 102 of FIG. 2 may be used, for example, in an RF-to-digital down-conversion of an RF feedback signal that is tapped from a power amplifier (PA) output. Although not shown in FIG. 2, in an RFPAL application, a similar down-conversion is performed for the RF input signal.

In an RFPAL application, an RF feedback signal is tapped from a power amplifier output signal and is down-converted. An out-of-band spectral emission of the down-converted RF feedback signal is then used as a "cost function" metric to automatically adjust the RFPD coefficients. In order to measure the power of the out-of-band spectrum, the entire down-converted feedback signal is sampled and digitized at a sampling rate greater than twice the bandwidth of the RF input signal. An additional method constructs the "cost function" from the total in-band and out-of-band nonlinear distortions. This method, however, requires accurate matching between the feedback signal and the input signal in the digital domain. The sampling rate of the signals is typically at least twice the bandwidth of the RF input. Therefore, the sampling rate of the ADCs in the RFSA subsystem imposes a hard limit on the maximum bandwidth of the RF input signal that can be linearized by the RFPAL. The techniques of the present invention overcome this hard limit.

A key component in RFSA 102 of FIG. 2 is the analog LPFs 204a and 204b at the input terminals of ADC 205a and 205b. Typically, each of LPFs 204a and 204b is a high-order filter with a stop-band rejection that is typically greater than 70 dB. LPF 204a and 204b each serve as an anti-aliasing filter and ADCs 205a and 205b each operate at a sampling rate $f_s$ that is at least twice the 70-dB bandwidths[1] ($B_{70dB}$) of the LPFs (i.e., $f_s \geq 2 B_{70dB}$). RFSA 102 can typically measure the power spectrum density of the incoming signal to within a frequency range between $f_0-B_{3dB}$ and $f_0+B_{3dB}$, where $f_0$ is the local oscillator (LO) frequency and $B_{3dB}$ is the 3 dB-bandwidth of each LPF. As the LO frequency is tunable, the power spectra of RF signals having bandwidths that are wider than 2 $B_{3d}$, can be constructed using a "spectrum stitching" technique. Using the "rule of thumb" expression:

$$\frac{B_{3dB}}{B_{70dB}} \approx 10^{\frac{-3.5}{n}}$$

one can estimate the order n of the required filter. Therefore, given the high sampling rate required, a high-order (e.g. n≥4) LPF is required to increase the valid frequency range of the spectrum measurement.

[1] Conventional cellular communication requires rejection of out-of-band emissions to 50 dB. The 70 dB figure-of-merit is selected for an additional margin of 20 dB.

Active filter circuits may be used to achieve a high-order LPF that can be integrated onto a CMOS integrated circuit. However, active filters generate undesirable noise. In one current CMOS implementation of an RFPAL, the LPFs in the RFSA are not designed as anti-aliasing filters due to the low-noise requirements. In that system, the maximum allowable bandwidth of the RF input signal is restricted to be no more than half the ADC's sampling rate for the reasons discussed above. One option to avoid the bandwidth restriction is to utilize off-chip, passive LPFs. For a cost-sensitive application, however, passive high-order LPFs are not suitable, as they are quite expensive.

FIG. 3(a) shows a technique for real-time monitoring of the out-of-band (OOB) emission power of a broadband RF signal. As shown in FIG. 3(a), RF feedback signal 301 is down-converted using LO 302. The center frequency of band-pass filter 303 following the down-conversion is an intermediate frequency (IF). Mean-square detector 304 measures an average output power in the output signal of BPF 303. System designers can choose the center frequency and bandwidth of BPF 303 according to the frequency plan of the RF input signal (e.g., the number of carriers, the carrier frequency allocation, and the per carrier bandwidth). To obtain a "cost function" that can be used to adapt the RFPD coefficients, the BPF output average power is measured at multiple frequency points of the LO. For an LO frequency $f_0$ and a BPF center frequency of $f_c$, the operation of the IF down-conversion, followed by filtering in BPF 303, effectively slices a portion of the signal spectrum around the frequency $f_c+f_0$. A cost-function metric for the out-of-band emission power can be then expressed as $$\sum_{k=1}^{n} P_k,$$

where $P_k$ is the BFI output power when the LO frequency $f_0=f_k$. The frequency points, $f_c+f_k$, are selected to cover frequency regions that have significant out-of-band emissions due to the nonlinearity in the power amplifiers. BPF 303 may be implemented using surface acoustic wave (SAW) filters, as low cost SAW filters are readily available.

In some applications, the RF input signal has a nearly white power spectrum within the signal bandwidth, and OOB emissions appear in two frequency regions: namely, the lower-side OOB and the upper-side OOB (i.e., OOB emissions at frequencies less than the lowest frequency of the signal bandwidth, and OOB emissions at frequencies greater than the highest frequency of the signal bandwidth). FIG. 3(b) shows an OOB emission monitor 310 for signals at two selected frequencies, in accordance with one embodiment of the present invention. Monitor 310 uses down-converters 322 and 323 in parallel, using LO 320 and 321, respectively, to down-convert feedback RF signal 315. The down-converted signals are combined in RF combiner 324 (e.g. a 3-dB coupler), band-pass filtered by BPF 325 and power detected in mean square detector 326. Los 320 and 321 may have predetermined and fixed frequencies.

The average power detector (e.g., mean square detector 304) may be implemented using, for example, a mixed design that does not include analog multipliers or analog squarer circuits at the detector front-end. One such average power detector employs a CMOS track-and-hold (T/H) circuit, followed by a digitizer and a mean-square calculator in the digital domain. The tracking time of the T/H circuit may be, for example, no more than $$\frac{1}{3f_c},$$

where $f_c$ is the BPF center frequency. One exemplary T/H circuit 400 is provided in FIG. 4(a). The clock frequency of T/H circuit 400 is typically a few tens of MS/s. The detected power is the mean-square value of the digitized samples. FIG. 4(b) shows a schematic circuit of pseudo-differential T/H circuit 450 in a CMOS implementation. As shown in FIG. 4(b), pseudo-differential T/H circuit 450 receives a pair of single-ended voltage signals (i.e., voltage signals $V_{in+}$ and $V_{in-}$) and converts the voltage difference of the discrete-time samples to provide a differential signal (i.e., voltage signals $V_{out+}$ and $V_{out-}$). In FIG. 4(b), transistors N3~N8 are provided to mitigate various undesirable effects (e.g. clock feedthrough, input-signal feedthrough, and channel charge injection) that may degrade the sampling accuracy of T/H circuit 450.

In many applications, the digital baseband characteristics of the PA output signal are available. FIG. 5 shows system 500 having an architecture that uses a sampled error monitor circuit, according to one embodiment of the present invention. In FIG. 5, feedback signal 501 of power amplifier 509 is down-converted in quadrature down-converter 501 to analog in-phase and quadrature baseband signals 503i and 503q, which are then compared with in-phase and quadrature signals 505i and 505q. In-phase and quadrature signals 505i and 505q are linearly filtered version of the original RF input signal. In FIG. 5, the pass band signals are represented by a pair of baseband signals. FIR filters 507a and 507b are used to achieve delay matching and to replicate the linear distortion of power amplifier 509. As shown in FIG. 5, error samples are obtained using T/H circuits 510a and 510b, each of which may be implemented by T/H circuit 450 of FIG. 4(b). The coefficients of FIR filters 507a and 507b may be adjusted to minimize the mean-square error (MSE), such that the residual MSE is dominated by nonlinear distortion and noise. Then, RFPD coefficients 516, which configure RFPD 515, are adjusted to minimize the residual MSE. The mean-square error is insensitive to the T/H clock rate, which can be much lower than the bandwidth of the RF signal. The architecture of system 500 of FIG. 5 has a significant advantage of not using—and thus avoiding the costs of—high-speed, high-precision ADCs.

FIG. 6 shows system 600, which uses an analog-IF predistortion technique for linearizing a broadband amplifier operating at microwave frequencies, in accordance with one embodiment of the present invention. As shown in FIG. 6, baseband in-phase and quadrature signals 601i and 601q are first converted into analog signals in DACs 602a and 602b and then up-converted in quadrature up-converter 603 using the intermediate frequency of LO 604. The resulting modulated IF signal 611 is predistorted in RFPD 605 and then upconverted in up-converter 606 to the final operating frequency of PA 609. Feedback signal 610 from PA 609 is down-converted in down-converter 607 to the IF frequency. Adaptation of RFPD coefficients 613 can be achieved using any one of the techniques discussed above.

In RFPAL techniques, the predistortion function is performed at an analog passband (i.e., the predistorter receives RF input signals). When digital baseband data are available, the predistortion function can also be performed at analog baseband, as illustrated in FIG. 7. Because a passband signal may be represented by its in-phase and quadrature components at baseband, the baseband analog predistorter (B-APD) 704 of FIG. 7 has dual input ports and dual output ports. B-APD 704 may be implemented as a polynomial pre-distorter. In one embodiment of the present invention, the polynomial pre-distorter may be implemented using an analog polynomial circuit.

The mathematical model for a memory-less polynomial predistorter, which is applicable to one form of B-APD 707, is first described. The input signals to the polynomial pre-distorter are denoted by $x_I(t)$ and $x_Q(t)$, where $x_I(t)$ is the in-phase component and $x_Q(t)$ is the quadrature component, respectively. Similarly, the output signals of the polynomial predistorter are denoted by $y_I(t)$ and $y_Q(t)$. The input/output relation of the polynomial predistorter may be expressed as:

$$y_I(t)+jy_Q(t)=\{f_I[p(t)]+jf_Q[p(t)]\}\cdot[x_I(t)+jx_Q(t)]$$

$$y_I(t)=x_I(t)\cdot f_I[p(t)]-x_Q(t)\cdot f_Q[p(t)]$$

or $$y_Q(t)=x_I(t)\cdot f_Q[p(t)]+x_Q(t)\cdot f_I[p(t)]$$

where $p(t)=x_I^2(t)+x_Q^2(t)$ is the instantaneous power of the input signal, and $f_I[p(t)]$ and $f_Q[p(t)]$ are polynomial functions of p(t), expressed as $$f_I(p) = \sum_{k=1}^{m} a_k p^k \text{ and } f_Q(p) = \sum_{k=1}^{m} b_k p^k,$$

with $a_k$ and $b_k$ being the corresponding polynomial coefficients. For example, choosing m=4, the polynomial predistorter can model up to 9th-order non-linearities. An analog polynomial circuit may be constructed using analog multipliers and summers. FIG. 8 shows analog polynomial circuit 800, implementing the function $$f(x) = \sum_{k=1}^{4} a_k x^k,$$

according to one embodiment of the present invention. As shown in FIG. 8, analog multipliers 801, 802 and 803 may be used to provide the higher order terms of the polynomial. To achieve accuracy, an analog summer (e.g., analog summer 804, 805 or 806) may be provided to subtract a calibrated compensation to a DC offset in each analog multiplier. Such DC offsets exist because broadband differential pairs use relatively small transistors, so that random mismatches between the transistors can generate large DC offsets.

FIG. 9 shows memory-less polynomial predistorter 900, using analog polynomial circuits 901 and 902, in accordance with one embodiment of the present invention. As shown in FIG. 9, system 900 implements the input/output expressions provided above, linking in-phase and quadrature signals $x_I(t)$ and $x_Q(t)$ with the output in-phase and quadrature signals $y_I(t)$ and $y_Q(t)$. In addition to polynomial circuits 901 and 902, each of which may be implemented by analog polynomial circuit 800 of FIG. 8, system 900 also uses analog multipliers 904 and 905 and analog complex multiplier 903. Analog summer 906 is provided to remove an offset values introduced by analog multiplier 904 and 905.

FIG. 10 shows baseband analog predistorter 1000, having the capability of compensating for memory effects in a power amplifier, according to one embodiment of the present invention. As shown in FIG. 10, baseband analog predistorter 1000 may be implemented by memory-less polynomial predistorter 900 of FIG. 9, augmented by a polynomial circuit processing a delayed version of the input signal. In FIG. 10, a delay is introduced by analog delay filter 1004. The delayed signal may then be processed using polynomial circuits 1001 and 1002 (e.g., each being a copy of polynomial circuit 800 of FIG. 8) and complex multiplier 1003 (e.g., a copy of multiplier 903 of FIG. 9). In FIG. 10, analog delay filter 1004 provides a delayed copy of the instantaneous power waveform. Such an analog delay filter may be implemented, for example, using an off-chip discrete analog delay element (e.g., analog delay or transmission line).

An analog delay filter, such as analog delay filter 1004, generally has a finite delay-bandwidth product. Particularly, it is difficult to realize an on-chip integrated filter with a sufficiently large delay for a broadband signal. Digital delay elements, however, can provide longer delays suitable for broadband applications. FIG. 11 illustrates system 1100, which includes baseband analog predistorter 1005, using digital delay elements, in accordance with one embodiment of the present invention. As shown in FIG. 11, system 11 uses digital delay elements 1003 and 1004 to create delayed versions of the input baseband signal. Digital delay elements 1003 and 1004 may be implemented using, for example, interpolating FIR filters. B-APD 1105 is shown to include two B-APDs 1108a and 1108b to process the instantaneous and delayed analog input signals, respectively. B-APDs 1108a and 1108b can each be implemented using polynomial pre-distorters, such as polynomial pre-distorter 900 and polynomial predistorter 1000, shown in FIGS. 9 and 10, respectively. The predistorted signal can then be up-converted by up-converter 1107, using LO 1106 for transmission in PA 1109.

The above detailed description is provided to illustrate the specific embodiments of the present invention disclosed herein and is not intended to be limiting. Many variations and modifications within the scope of the present invention are possible. The present invention is set forth in the following claims.

We claim:

1. An RF linearizer for a power amplifier, comprising:
   a quadrature up-converter for up-converting a baseband input signal that is to be transmitted by the power amplifier;
   an RF analog predistorter controlled by a set of coefficients for predistorting the up-converted input signal;
   a down-converter for down-converting an output signal of the power amplifier;
   an error monitor receiving the down-converted output signal and the input signal for providing an error signal; and
   a signal analyzer receiving the error signal, the signal analyzer using an out-of-band power spectrum of the error signal to optimize the set of coefficients.

2. The RF linearizer of claim 1, wherein the up-converter up-converts the input signal to an intermediate frequency between baseband and a frequency at which the input signal is to be transmitted.

3. The RF linearizer of claim 2, wherein the down-converter down-converts the output signal to the intermediate frequency.

4. The RF linearizer of claim 1, wherein the error monitor comprises one or more track and hold circuits.

5. The RF linearizer of claim 1, wherein the input signal has an in-phase component and a quadrature component.

6. The RF linearizer of claim 1, wherein the input signal is filtered by a set of finite impulse response filters prior to being received into the error monitor.

7. The RF linearizer of claim 6, wherein the finite impulse response filters reduces mean square error in the error signal.

8. The RF linearizer of claim 7, wherein the set of coefficients reduce the residue mean square error in the error signal.

9. The RF linearizer of claim 1, wherein the out-of-band power spectrum comprises out-of-band emissions at multiple signal regions.

10. A linearizer for a power amplifier receiving a baseband input signal, comprising:
    a baseband analog predistorter for predistorting the baseband input signal comprising one or more polynomial circuits, the polynomial circuits each comprising analog multipliers, summers and one or more complex multipliers and each implementing a polynomial function in the form of $$f(x) = \sum_{k=1}^{n} a_k x^k,$$

where n is an integer greater than one; and
    an up-converter for up-converting the predistorted baseband input signal to a frequency designated for transmission by the power amplifier.

11. The linearizer of claim 10, wherein the baseband input signal includes an in-phase component and a quadrature component.

12. The linearizer of claim 10, wherein the baseband input signal is a digital signal, wherein the linearizer further comprises one or more digital-to-analog converters to provide the baseband input signal as an analog signal to the baseband analog predistorter.

13. The linearizer of claim 10, further comprises a plurality of summers each provided for eliminating a DC offset voltage associated with each analog multiplier.

14. The linearizer of claim 10, wherein the baseband analog predistorter further comprises a delay filter for delaying the baseband input signal.

15. The linearizer of claim 14, wherein the delay filter comprises an off-chip analog delay element.

16. The linearizer of claim 14, wherein the delay filter comprises a digital delay element.

17. A method for linearizing a power amplifier, comprising:
    up-converting a baseband input signal that is to be transmitted by the power amplifier;
    predistorting the up-converted input signal in an RF analog predistorter controlled by a set of coefficients;
    down-converting an output signal of the power amplifier;

obtaining an error signal that is a difference between the down-converted output signal and the input signal; and monitoring the error signal in a signal analyzer, the signal analyzer using an out-of-band power spectrum of the error signal to optimize the set of coefficients.

18. The method of claim 17, wherein the input signal is up-converted to an intermediate frequency between baseband and a frequency at which the input signal is to be transmitted.

19. The method of claim 18, wherein the output signal is down-converted to the intermediate frequency.

20. The method of claim 17, wherein the error signal is obtained using one or more track and hold circuits.

21. The method of claim 17, wherein the baseband input signal has an in-phase component and a quadrature component.

22. The method of claim 17, further comprising filtering the baseband input signal in a set of finite impulse response filters and providing the filtered signal to obtain the error signal.

23. The method of claim 22, wherein the finite impulse response filters reduce mean square error in the error signal.

24. The method of claim 23, wherein the set of coefficients reduce the residue mean square error in the error signal.

25. The method of claim 17, wherein the out-of-band power spectrum comprises out-of-band emissions at multiple signal regions.

26. A method for linearizing a power amplifier, comprising:

receiving a baseband input signal;

predistorting the baseband input signal in a baseband analog predistorter that comprises one or more polynomial circuits, the polynomial circuits each comprising analog multipliers, summers and one or more complex multipliers and each implementing a polynomial function in the form of $$f(x) = \sum_{k=1}^{n} a_k x^k,$$

where n is an integer greater than one; and up-converting the predistorted baseband input signal to a frequency designated for transmission by the power amplifier.

27. The method of claim 26, wherein the baseband input signal includes an in-phase component and a quadrature component.

28. The method of claim 26, wherein the baseband input signal is a digital signal, wherein the method further comprises providing one or more digital-to-analog converters to convert the baseband input signal to an analog signal for the baseband analog predistorter.

29. The method of claim 26, further comprises providing a summer to eliminate a DC offset voltage associated with each analog multiplier.

30. The method of claim 26, wherein the baseband analog predistorter further comprises delaying the baseband input signal in a delay filter.

31. The method of claim 30, wherein the delay filter comprises an off-chip analog delay element.

32. The method of claim 30, wherein the delay filter comprises a digital delay element.

* * * * *